United States Patent [19]
Liu et al.

[11] Patent Number: 5,874,328
[45] Date of Patent: Feb. 23, 1999

[54] REVERSE CMOS METHOD FOR DUAL ISOLATION SEMICONDUCTOR DEVICE

[75] Inventors: Yowjuang W. Liu, San Jose; Kuang-yeh Chang, Los Gatos, both of Calif.

[73] Assignee: Advanced Micro Devices, Inc., Sunnyvale, Calif.

[21] Appl. No.: 886,131

[22] Filed: Jun. 30, 1997

[51] Int. Cl.$^6$ .................................................. H01L 21/8238
[52] U.S. Cl. .......................... 438/199; 438/221; 438/224; 438/225; 438/233; 438/296; 438/430; 438/621; 438/638; 438/648; 438/656
[58] Field of Search .................................... 438/199, 218, 438/221, 223, 225, 296, 224, 233, 430, 621, 168, 172, 216, 217, 227, 648, 637, 638, 656; 257/370, 374, 338, 351, 357, 369; 148/DIG. 20, DIG. 106, DIG. 50

[56] References Cited

U.S. PATENT DOCUMENTS

| | | |
|---|---|---|
| 4,764,484 | 8/1988 | Mo . |
| 4,927,777 | 5/1990 | Hsu et al. .................................. 437/44 |
| 4,980,306 | 12/1990 | Shimbo ..................................... 437/34 |
| 5,015,594 | 5/1991 | Chu et al. ................................. 437/31 |
| 5,055,423 | 10/1991 | Smith et al. . |
| 5,573,969 | 11/1996 | Kim .......................................... 437/57 |

FOREIGN PATENT DOCUMENTS

| | | | |
|---|---|---|---|
| 401125971 | 5/1989 | Japan ..................................... 438/227 |
| 402058368 | 2/1990 | Japan ..................................... 438/216 |

*Primary Examiner*—Michael Trinh
*Assistant Examiner*—Long Pham

[57] ABSTRACT

CMOS transistors are formed by a damascene process resulting in field oxide regions exhibiting essentially no bird's beak portions. A trench isolation is also formed in a source/drain region each transistor between adjacent junctions.

20 Claims, 5 Drawing Sheets

REVERSE CMOS METHOD FOR DUAL ISOLATION SEMICONDUCTOR DEVICE

TECHNICAL FIELD

The present invention relates to a semiconductor device comprising a dual isolation structure, and to a method of manufacturing the semiconductor device utilizing a damascene technique. The invention has particular applicability in semiconductor devices having submicron technology and/or designed for high performance.

BACKGROUND ART

The escalating requirements for increased densification and performance in ultra-large scale integration semiconductor wiring require integrated circuits capable of operating at higher speeds while having reduced-size geometries and greater packing densities. The shrinkage of geometries into the submicron range has increased circuit density, reduced contact holes, and narrowed line widths. Consequently, the resistance of the device elements increases along with the resistance capacitance (RC) time constants, thereby limiting the overall device speed. The rapid drive toward increased densification has strained the limits of existing materials and methodology, thereby requiring responsive changes in various aspects of semiconductor manufacturing technology.

Conventional practices employed in the manufacture of semiconductor devices, such as bulk silicon CMOS devices, confront various fundamental performance and reliability limitations, particularly in scaling down the size of a device. These limitations include high junction capacitance, ineffective isolation and latch-up sensitivity. High junction capacitance is primarily attributed to high doping levels required to prevent transistor punch-through and parasitic leakage or field turn on. Scale down LOCOS techniques reduces the effective spacings separating adjacent active regions in a semiconductor substrate and, thereby, increases transistor cross-talk and/or latch-up problems. In order to overcome these problems, conventional practices involve the use of larger than minimum isolation spacings and areas, which is inconsistent with the requirements for high densification. Other conventional approaches comprise the use of inefficient guard ring/bar structures which also increases the die size. An increase in die size requires longer interconnects and, hence, results in products with reduced integrated circuit speeds, i.e., greater RC delays.

A conventional alternative design to avoid the disadvantages of the LOCOS techniques, or modified LOCOS techniques, comprises trench isolation. Advantages of trench isolation include improved latch up and field turn on. However, trench isolation is attendant upon various problems, such as I-V kinks, sidewall leakages, low gate oxide breakdowns, and require significantly more complicated manufacturing steps. In order to overcome trench induced sidewall leakages, higher doping is normally introduced along trench sidewalls. Such high doping increases the junction capacitance. The disadvantageous unreliability and performance attributed to the gate oxide and junction capacitance, respectively, render trench isolation unsatisfactory for high volume production.

Another conventional approach is known as silicon-on-insulator (SOI) structures, wherein, a buried oxide region is provided under the surface semiconductor substrate in the active region. SOI structures advantageously provide lower junction capacitance, improved isolation and improved latch up. However, SOI structures suffer from various problems, such as a high number of defects, I-V kinks due to floating body effects and lattice heating, high source/drain resistance and random threshold voltage behavior.

Other attempts to satisfy the requirements for increased densification include use of refractory metals and refractory metal silicides which exhibit high conductivity and low resistance and form highly reliable interconnect patterns. However, it has become increasingly difficult to achieve the requisite planarized topography to satisfy the demands for multilevel semiconductor devices. Damascene techniques have been developed which basically comprise forming an opening in a dielectric layer and filling the opening with conductive material. See, for example, Mo, U.S. Pat. No. 4,764,484 and Smith et al., U.S. Pat. No. 5,055,423.

There exists a need for a semiconductor device having an improved isolation structure, particularly for ultra high density integrated circuitry. There also exists a need for a simplified, efficient, cost-effective method of manufacturing a semiconductor device with improved isolation, which method can be integrated into conventional MOSFET methodology. There further exists a need for a method which simplifies deep-submicron technology and, facilitates the definition of gate electrode dimensions yielding a semiconductor device exhibiting lower junction capacitance, higher performance, improved reliability and particularly improved topography.

DISCLOSURE OF THE INVENTION

An object of the present invention is a semiconductor device having an improved isolation structure with reduced junction capacitance, higher operating speeds and an improved signal-to-noise ratio.

Another object of the present invention is an efficient, cost-effective method of manufacturing a semiconductor device having reduced junction capacitance, higher operating speeds and an improved signal-to-noise ratio.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: PMOS transistors and NMOS transistors formed on a main surface of the semiconductor substrate, each transistor comprising a source/drain region; a field oxide region isolating a PMOS transistor from an NMOS transistor; and a trench isolation extending through a source/drain region of each transistor into the substrate isolating adjacent junctions.

Another aspect of the present invention is a method of manufacturing a semiconductor device comprising CMOS transistors, which method comprises: forming an insulating layer on a main surface of a semiconductor substrate; etching a portion of the insulating layer through a first resist mask to a first depth within but not completely through the insulating layer to form a first opening; etching the insulating layer through a second resist mask to form second openings within the first opening extending to a second depth greater than the first depth, leaving field oxide regions for isolating CMOS transistors, which field oxide isolating regions have essentially no tapering bird's beak portions adjacent active regions; filling the first and second openings with a conductive material to form gate electrodes of CMOS transistors in the second openings and a gate interconnection in the first opening; ion implanting impurities to form source/drain regions of the CMOS transistors; and forming a trench isolation through a source/drain region in each CMOS transistor, which trench isolation extends into the substrate to isolate adjacent junctions.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
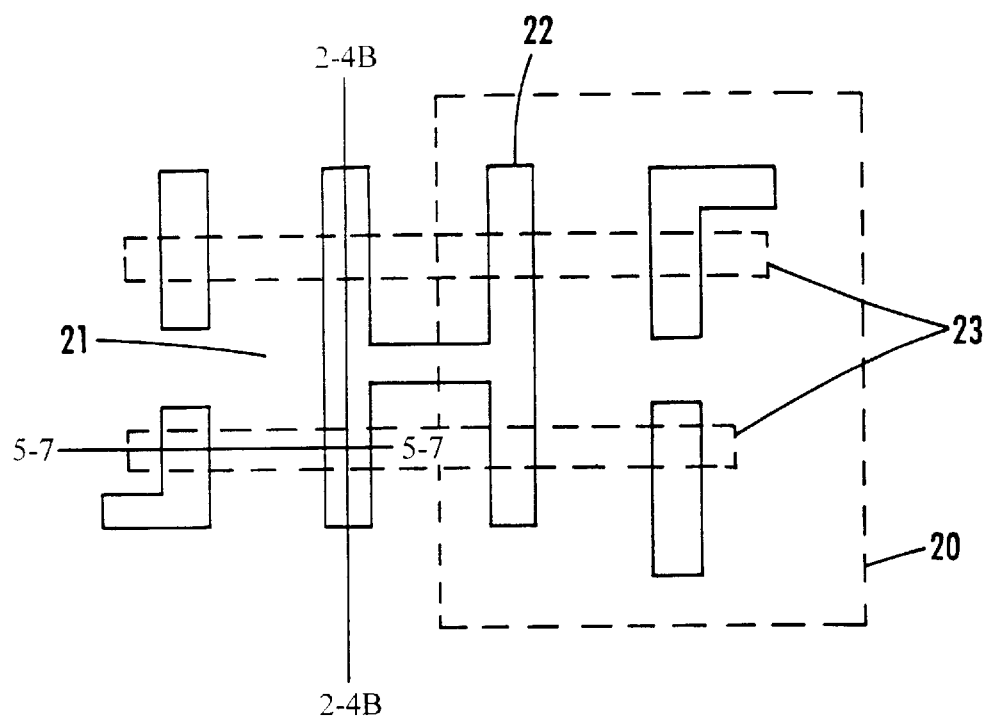
FIG. 1 illustrates a top view depicting gate masks employed in the inventive method.
Figure 2:
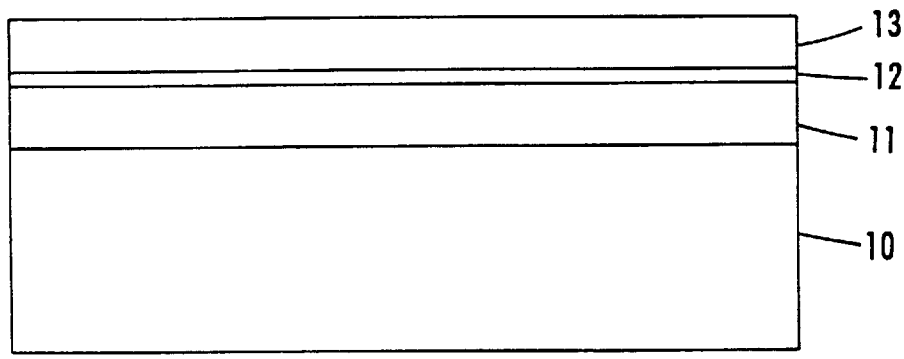
FIGS. 2 through, 4B are cross-sectional views taken along line 2-4B—2-4B in FIG. 1 schematically depicting sequential processing stages of the present invention.

The present invention provides advanced CMOS methodology for deep-submicron semiconductor devices which facilitates formation of high density circuitry having improved linearity, improved accuracy, higher operating speeds, improved signal-to-noise ratio, and overall reliability. The inventive method is cost-effective, efficient, and can easily be integrated into conventional semiconductor processing technology employing conventional equipment.

Conventional LOCOS techniques result in a field oxide region having tapering bird's beak portions adjacent isolated active regions. Such tapering bird's beak portions disadvantageously occupy precious real estate, which is antithetic to the objectives of increased integration. The present invention avoids the disadvantages of, iter alia, field oxide regions comprising tapering bird's beak portions while improving planarization. These objectives, consistent with increased integration, are achieved by the inventive method which comprises a reverse CMOS or damascene technique. In accordance with the present invention, an insulation layer is formed having relatively uniform topography. A plurality of masks are then employed to form openings therein, which openings are filled with conductive material to form gate electrodes and a gate interconnection structure. Thus, a damascene technique, such as a dual damascene technique, is employed to form the gate electrodes, gate interconnection structure and field oxide regions. Advantageously, the field oxide regions formed in accordance with the inventive method are virtually devoid of a typical tapering bird's beak portion characteristic of conventional thermally grown field oxide regions formed by LOCOS techniques.

The inventive method can be advantageously employed to produce a semiconductor device comprising CMOS transistors. Initially, an insulating layer is formed on a main surface of a doped semiconductor substrate, e.g., a silicon semiconductor substrate doped with a P-type impurity. The insulating layer can be formed by any of various conventional techniques, including chemical vapor deposition, and is formed with a relatively uniform or planar topography. A first resist mask is formed on the insulating material, and etching is conducted to form a first opening extending to a first depth within the insulating layer. Etching is then conducted through a second resist mask to etch portions of the insulating layer to form second openings within the first opening extending to a second depth greater than the first depth, leaving regions of the relatively uniform insulating layer to function as field oxide regions virtually devoid of any tapering bird's beak portions for isolating active regions.

In an embodiment of the inventive method, etching through the second resist mask is conducted to form second openings extending to a second depth in the insulating layer leaving a thin portion of the insulating layer on the semiconductor substrate to function as a gate oxide layer. In an alternate embodiment, etching is conducted through the second resist mask to form second openings extending completely through the insulating layer to and exposing portions of the main surface of the semiconductor substrate, in which case a thin gate oxide layer is formed on the exposed portions of the semiconductor surface under the second openings, as by thermal oxidation or vapor deposition.

In accordance with the inventive method, the first and second openings are filled in with conductive material, preferably simultaneously, to form a plurality of gate electrodes in the second openings electrically connected by the conductive material occupying the first opening forming a gate interconnection. Thus, the gate electrodes, gate interconnection and field oxide regions are formed in efficient manner by employing a plurality of masks and a dual damascene technique. Impurities are then ion implanted to form source/drain regions of the CMOS transistors. Preferably, the source/drain regions comprise low and high impurity density regions formed by implanting impurities using sidewall spacers on the gate electrodes as masks.

In accordance with the present invention, after completion of the transistors, a trench isolation is then formed through a source/drain region in each CMOS transistor extending into the substrate to isolate adjacent junctions. Subsequent back end processing, i.e., subsequent to completion of the transistors, can be conducted in a conventional manner.

In forming CMOS transistors, a well region having a conductivity type different from that of the substrate, is initially formed. For example, when employing a P-type semiconductor substrate, an N-well is initially formed in which the PMOS transistor is formed.

The insulating layer and conductive material employed in the present invention can be any of those conventionally employed in manufacturing semiconductor devices. For example, the conductive material can be polycrystalline silicon or a polysilicide structure comprising polycrystalline silicon and a metal silicide thereon. Any of various metals can also be employed.

In a preferred embodiment of the present invention, the insulating layer is formed by sequentially forming a first silicon dioxide layer, a silicon nitride etch stop layer on the first silicon dioxide layer, and a second silicon dioxide layer on the silicon nitride layer. Thus, when etching through the first mask, the first opening is formed extending through the second silicon dioxide layer to the silicon nitride layer which functions as an etch stop layer. Subsequently, the silicon nitride layer is removed and etching is conducted through the second mask to form second openings extending into the first silicon dioxide layer.

Figure 3:
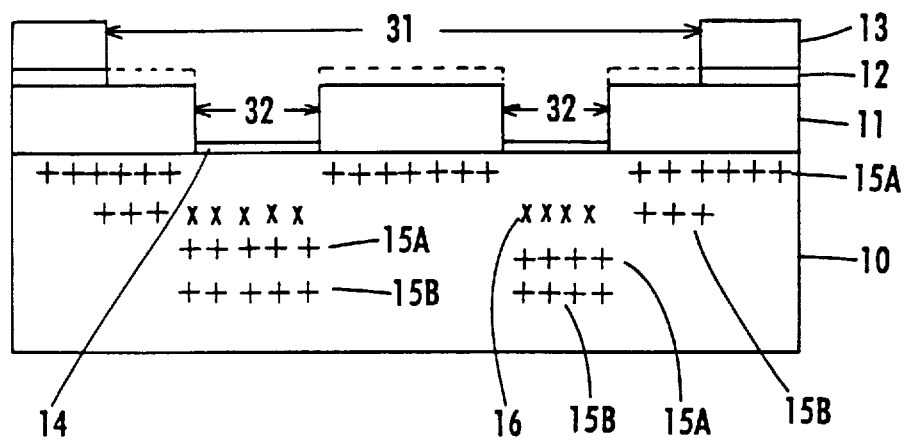

In accordance with the present invention, ion implantation of impurities can be conducted to form field and/or channel implants as, for example, ion implantation through opening 32 depicted in FIG. 3. In so doing, the field implants are generally shallower employing a relatively lower implantation energy than that used when forming the channel implants which prevent punch through. In forming the source/drain regions in accordance with the present invention, it has been found advantageous to initially implant impurities to form P-type low impurity density regions, and sequentially implanting impurities to form N-type low impurity density regions, N-type high impurity density regions, and P-type high impurity density regions.

In an embodiment of the present invention, a silicide structure is formed on the source/drain regions and gate electrodes by depositing a refractory metal thereon and rapidly annealing an elevated temperature to react the refractory metal with the underlying silicon to form the refractory metal silicide.

In accordance with the present invention, a trench isolation is formed by etching through a mask to form a trench in a substrate. Subsequently, oxidation is conducted to form a thin oxide lining on the trench, simultaneously activating the source/drain regions. An interlayer insulating film is then deposited, simultaneously filling the trench.

The semiconductor device formed in accordance with the present invention comprises CMOS transistors formed on the main surface of the semiconductor substrate, i.e., PMOS and NMOS transistors, each of which comprises source/drain regions. Field oxide regions isolate the PMOS transistor from the NMOS transistor and a trench isolation extends through a source/drain region of each CMOS transistor into the substrate isolating adjacent junctions. The field oxide region separating the CMOS transistors is essentially devoid of any tapering bird's beak portion between adjoining active regions.

Adverting to FIGS. 1 through 4B, a semiconductor substrate 10 is provided, such as a P-type semiconductor substrate and an N-well 20 formed therein. A first silicon dioxide layer 11 is formed on the main surface of the semiconductor substrate in a conventional manner, as by chemical vapor deposition. A thin silicon nitride etch stop layer 12 is then deposited on the first silicon dioxide layer, and a second silicon dioxide layer 13 is then deposited on the silicon nitride etch stop layer. A first opening 31 is initially formed which, when filled with conductive material, forms a gate interconnection structure. Using the first gate mask 22, etching is conducted through second silicon dioxide layer 13 to form first opening 31 stopping at silicon nitride etch stop layer 12. The portion of silicon nitride etch stop layer 12 under first opening 31, shown by dotted lines in FIG. 3, is then removed. Using a second gate mask 23, shown in FIG. 1, etching is conducted through first silicon dioxide layer 11 to form second openings 32, leaving silicon dioxide portions 14 serving as a pad or sacrificial oxide during implantation, which pad oxide is subsequently removed. In an embodiment of the present invention, impurity implantation is conducted at this point to form field implants 15A and 15B at different depths and/or channel implants 16 through openings 32. The composite masking contour of layers 11, 12 and 13 in FIG. 3 advantageously enables, in a single ion implantation, distribution of impurities at different depths to form a retrograde well structure for improved performance. Pad oxide layers 14 are then removed in a conventional manner. In FIG. 1, reference numeral 21 denotes resist.

In an alternate embodiment, second openings 32 are etched entirely through first silicon dioxide layer 11 exposing portions of semiconductor substrate 10. In this embodiment, gate dielectric layer 14a is formed by any of various conventional techniques, such as thermal oxidation, chemical vapor deposition or TEOS (tetraethyl orthosilicate). Souce/drain regions are then formed in a manner unlike conventional practices. Conventionally, a nitride layer is formed and a LOCOS field oxide region formed thereon, with definition of the source/drain region complete upon forming the gate electrode. In accordance with the present invention, source/drain regions are formed by etching the composite insulating stack 11, 12, 13 (shown in FIG. 4A). Adverting to FIG. 4B, source/drain regions 410, 411 are formed by ion implantation utilizing source/drain mask 412. In FIG. 4B, reference numeral 414 denotes gate electrodes and reference numeral 413 denotes the N-well.

In another embodiment, the polycrystalline silicon layer is doped with an impurity of an appropriate type, prior to depositing refractory metal thereon. The metal silicide formed after appropriate thermal treatment conveniently protects the gate electrode from impurity penetration during impurity implantations to form the source/drain regions. This technique conveniently avoids problems encountered in conventional practices wherein the polycrystalline layer is exposed to ion implantation during formation of source/drain regions, particularly boron penetration. Such impurities which penetrate into the gate electrode subsequently penetrate through the gate insulating layer into the channel region, thereby degrading device performance as by causing a change in the threshold voltage.

Figure 4A:
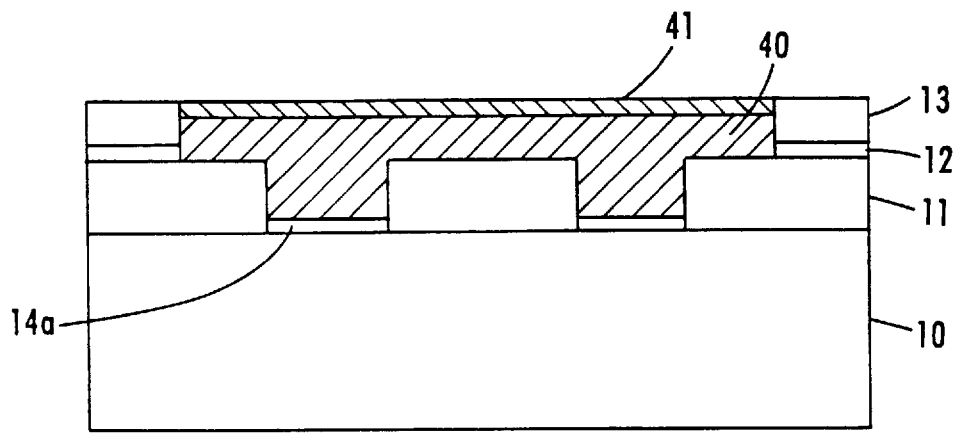
Figure 4B:
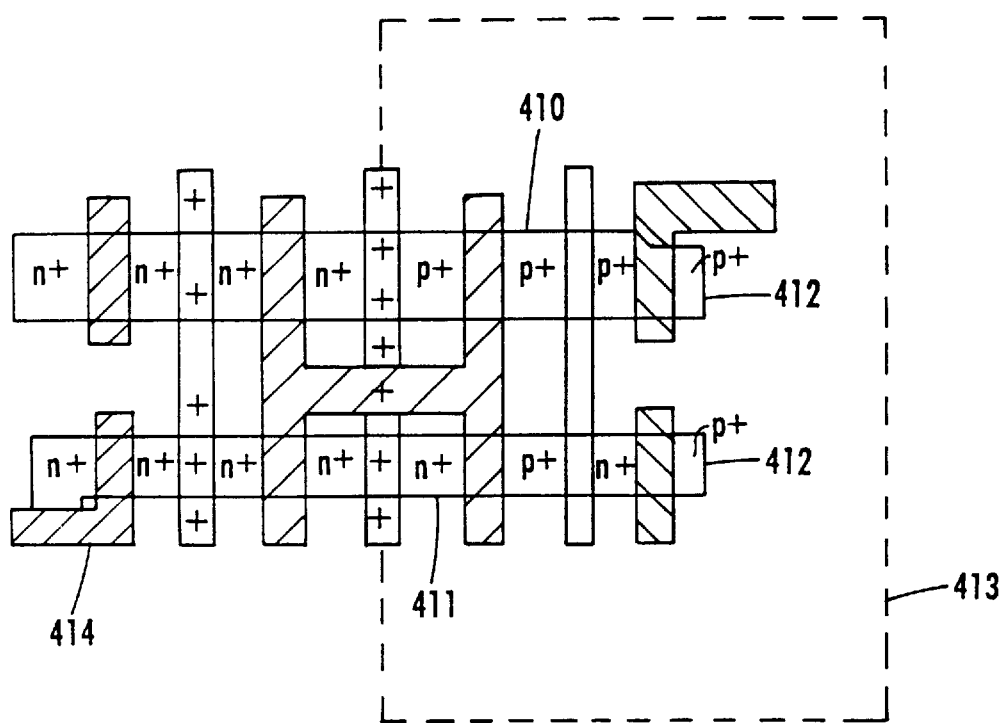

As shown in FIG. 4A, first opening 31 and second opening 32 are filled with a conductive material, preferably polycrystalline silicon or a polysilicide structure comprising polycrystalline silicon 40 and a metal silicide 41 formed thereon. The polysilicide structure can be advantageously formed by depositing polycrystalline silicon, depositing a refractory metal on polycrystalline silicon, and annealing at a temperature sufficient to react the refractory metal with the underlying silicon to form a refractory metal silicide on the polycrystalline silicon.

The present invention advantageously enables improved planarized topography. CMP planarization can be conducted after filling the first and second openings with conductive material to achieve a relatively flat surface as shown in FIG. 4A.

Subsequent processing comprises ion implantation to form source/drain regions for the CMOS transistors, each source/drain region preferably comprising low impurity density regions and high impurity density regions. Such low and high impurity density regions can be formed by initially ion implanting impurities to form low impurity density regions using the gate electrodes as masks, forming sidewall insulating spacers on the gate electrodes and then ion implanting using the sidewall spacers as masks to form the high impurity density regions. In a preferred embodiment, ion implantation is initially conducted to form P-type low impurity density regions. Subsequently, impurities are implanted to sequentially form N-type low impurity density regions, Nhigh impurity density regions, and P-high impurity density regions.

Figure 5:
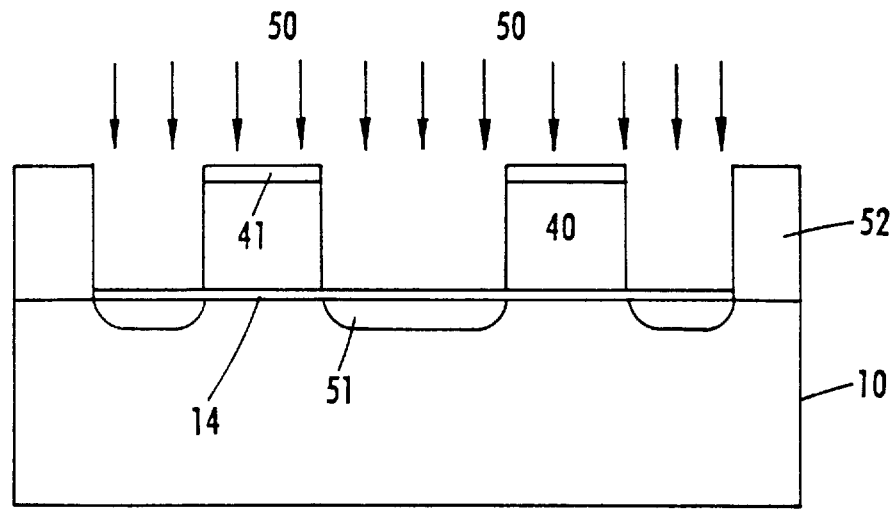
FIGS. 5 throufh 7 are cross-sectional views taken along line 5-7—5-7 in FIG. 1 schematically depicting sequential processing stages of the present invention.

As shown in FIG. 5, ion implantation, indicated by arrows 50, is conducted to form low impurity density regions 51.

Figure 6:
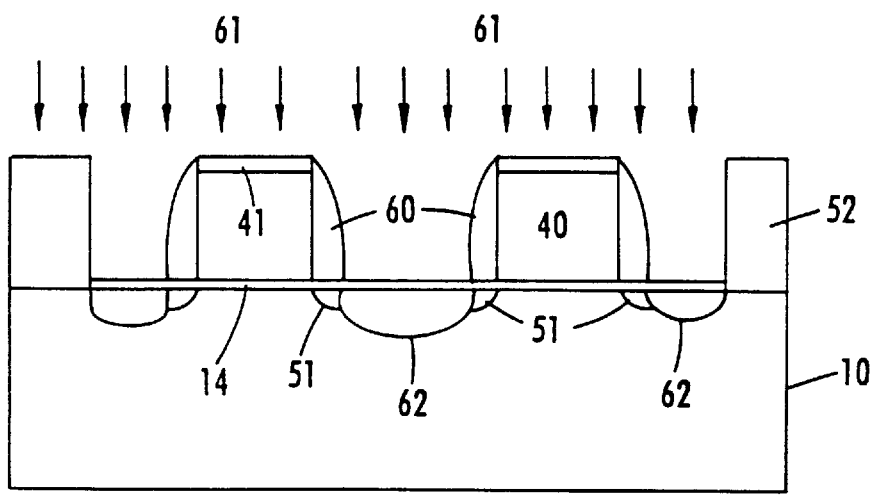

Field oxide regions 52 are advantageously essentially devoid of any tapering bird's beak portion. As shown in FIG. 6, sidewall insulating spacers 60 are then formed on gate electrodes, 40, 41 and ion implantation, indicated by arrows 61, is conducted to form high impurity density regions 62. The source/drain regions can be silicided in a conventional manner, as by deposition of a refractory metal followed by rapid thermal annealing to form a refractory metal silicide (not shown). As one having ordinary skill would recognize, a spacer can be formed and the light and heavily doped regions formed thereafter in a conventional manner by suitable selection of implantation energy and/or species. In addition, the spacer can be omitted by depositing a thin buffer layer followed by ion implantation.

Figure 7:
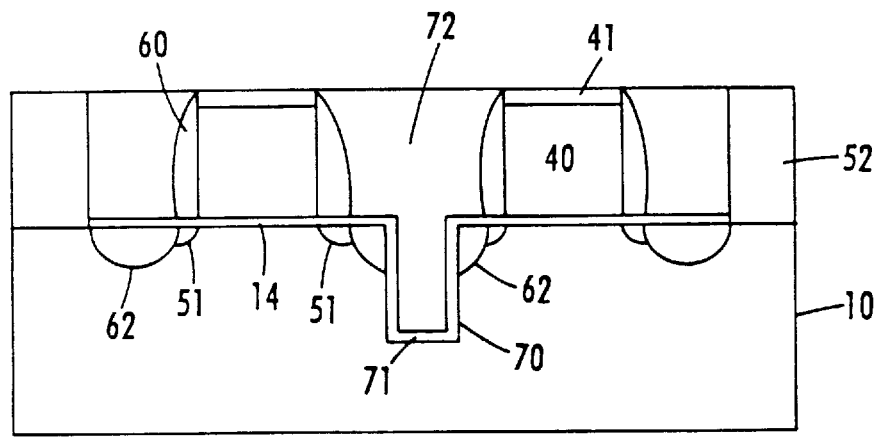

The present invention further comprises forming a trench isolation through the source/drain regions of CMOS transistors to isolate adjacent junctions. Adverting to FIG. 7, substrate 10 is etched using a trench mask to form trench 70 through a source/drain region. A thin oxide layer 71 is then formed to line the trench, as by heating, thereby simultaneously activating the source/drain regions. Subsequently, an interlayer dielectric 72 is applied, thereby simultaneously filling the trench 70 to effect isolation between adjacent junctions. CMP polishing is advantageously performed at this point and then contact holes are formed. Subsequent processing is conducted in accordance with conventional back end procedures.

Figure 8:
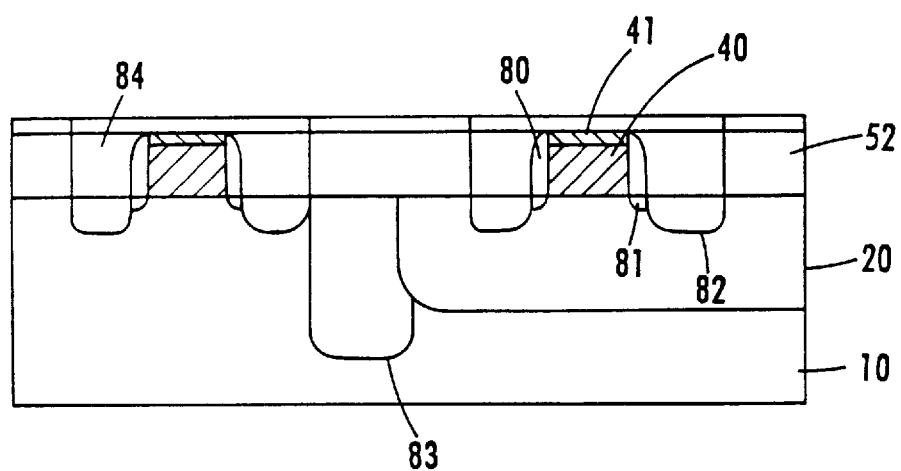
FIG. 8 schematically illustrates a CMOS structure formed by the inventive method.

A CMOS transistor is illustrated in FIG. 8 and comprises N-well 20 in P-type semiconductor substrate 10. A P-MOS transistor is formed in N-well 20 comprising: gate electrode 40, 41, and source/drain regions comprising low impurity density regions 81 and high impurity density regions 82. Reference numerals 80 and 52 denote insulating sidewall spacers and field oxide regions, respectively. After formation of trench isolation region 83, interlayer dielectric layer 84 is deposited to fill trench and fill the spaces between the gate electrodes and field oxide regions. Planarization is subsequently performed as by conventional chemicalmechanical polishing.

The present invention offers numerous advantages vis-à-vis conventional methodology. Notably, the inventive method is economic, efficient, and streamlined. The resulting semiconductor device exhibits improved reliability, improved linearity, improved accuracy, is capable of functioning at higher operating speeds with improved signal-to-noise ratio and exhibits improved wear characteristics. The inventive method is suitable for deep-submicron technology and results in a fully planar structure. The gate electrodes are accurately defined by a flat oxide before formation of the active source/drain regions. The present invention is advantageously characterized by the virtual absence of tapering bird's beak portions on field oxide regions. The gate oxide does not exhibit any degradation, as by etching in conventional isolation techniques. The trench isolation utilized in the present invention is only applied to isolate junctions, not the gate electrodes. Accordingly, a tight layout is provided with highly effective isolation. The present invention provides lower junction capacitance and higher performance stemming from the superior isolation formed by the trench for junctions, thereby preventing junction leakage.

In accordance with the present method, the definition of the gate dimensions is simplified and accurate, in that an oxide layer is etched, vis-à-vis conventional practices wherein a sandwich gate structure is etched. The present invention does not require new processing equipment, in that it can be easily integrated into existing apparatus and conventional methodology by simply changing the arrangement. The inventive semiconductor device exhibits improved reliability and does not suffer from alignment sensitivities between a gate mask and the source/drain region.

The materials and processing techniques, such as deposition, photolithographic and etching techniques, employed in the present invention are those typically employed in manufacturing conventional semiconductor devices and, hence, not set forth herein detail. Although the present invention is applicable to various types of semiconductor devices, it enjoys particular utility in semiconductor devices having minimal submicron design features and interwiring spacings, thereby enabling high integration and densification. The present invention is, therefore, applicable to any of various types of semiconductor devices, including CMOS technology and electrically programmable devices.

Only the preferred embodiment of the invention and but a few examples of its versatility are shown and described in the present invention. It is to be understood that the invention is capable of use in various other combinations and environments and is capable of changes or modifications within the scope of the inventive concept as expressed herein.

We claim:

1. A method of manufacturing a semiconductor device comprising CMOS transistors, which method comprises:
    forming an insulating layer on a main surface of a semiconductor substrate;
    forming a first resist mask on the insulating layer;
    etching a portion of the insulating layer through a first resist mask to a first depth within but not completely through the insulating layer to form a first opening;
    forming a second resist mask on the insulating layer;
    etching the insulating layer through a second resist mask to form second openings within the first opening extending to a second depth greater than the first depth, leaving field oxide regions for isolating CMOS transistors, which isolating regions have essentially no tapering bird's beak portions adjacent active regions;
    filling the first and second openings with a conductive material to form gate electrodes of CMOS transistors in the second openings and a gate interconnection in the first opening;
    ion implanting impurities to form source/drain regions of the CMOS transistors; and
    forming a trench isolation through a source/drain region in each CMOS transistor, which trench isolation extends into the substrate to isolate adjacent junctions.

2. The method according to claim 1, comprising simultaneously filling the first and second openings with a conductive material.

3. The method according to claim 1, comprising implanting impurities of a conductivity type opposite to that in the semiconductor substrate to form a well implant in the semiconductor substrate prior to forming the insulating layer.

4. The method according to claim 3, comprising: implanting impurities to form an N-well in a P-type semiconductor substrate; and forming a PMOS transistor in the N-well.

5. The method according to claim 1, wherein the insulating layer comprises silicon dioxide.

6. The method according to claim 5, comprising forming the insulating layer by:
    depositing a first silicon dioxide layer;
    depositing a layer of silicon nitride on the first silicon dioxide layer; and depositing a second silicon dioxide layer on the silicon nitride layer.

7. The method according to claim 6, comprising etching through the first mask to form the first opening extending through the second silicon dioxide layer to the silicon nitride layer, wherein the silicon nitride layer serves as an etch stop layer.

8. The method according to claim 7, comprising: etching to remove the silicon nitride layer; and etching through the second mask to form the second openings extending into the first silicon dioxide layer, thereby forming a profiled composite mask.

9. The method according to claim 1, wherein the second openings extend completely through the insulating layer to and expose portions of the main surface of the semiconductor substrate.

10. The method according to claim 9, further comprising oxidizing the main surface of the semiconductor substrate to form a gate oxide layer on the exposed portions of the semiconductor substrate at the bottom of the second openings.

11. The method according to claim 1, further comprising implanting into the substrate impurities to form field and/or channel implants.

12. The method according to claim 1, wherein the conductive material comprises polycrystalline silicon or a polysilicide structure of polycrystalline silicon and a metal silicide thereon.

13. The method according to claim 8, comprising implanting impurities to form field and/or channel implants, wherein, by virtue of the profiled composite mask, the impurities are implanted at different depths in the semiconductor substrate to form a retrograde well structure.

14. The method according to claim 1, comprising:
simultaneously forming the gate electrodes and interconnection layer in electrical contact with the gate electrodes in a single metal deposition step.

15. The method according to claim 1, comprising:
depositing an insulating layer on a semiconductor substrate;

etching the insulating layer through a mask to form openings; and implanting impurity ions through the openings to form source/drain regions.

16. The method according to claim 1, comprising forming the trench isolation by:

etching through a mask to form a trench in the substrate;

oxidizing to form a thin oxide layer lining the trench and simultaneously activating the source/drain regions; and depositing an interlayer insulating film simultaneously filling the trench.

17. A method of manufacturing a semiconductor device, comprising:

forming a plurality of transistors on a semiconductor substrate separated by a field oxide region; and subsequently forming a trench isolation extending through a source/drain region of each transistor into the semiconductor substrate isolating adjacent junctions.

18. The method according to claim 17, comprising:

depositing an insulating layer on the semiconductor substrate; and etching the insulating layer to form openings defining gate electrodes.

19. The method according to claim 18, comprising:

simultaneously forming the gate electrodes and interconnection layer in electrical contact with the gate electrodes in a single metal deposition step.

20. The method according to claim 17, comprising:

depositing an insulating layer on the semiconductor substrate;

etching the insulating layer through a mask to form openings; and implanting impurity ions through the openings to form source/drain regions.

* * * * *